United States Patent [19]
Dubin

[11] Patent Number: 6,077,780
[45] Date of Patent: Jun. 20, 2000

[54] METHOD FOR FILLING HIGH ASPECT RATIO OPENINGS OF AN INTEGRATED CIRCUIT TO MINIMIZE ELECTROMIGRATION FAILURE

[75] Inventor: Valery M. Dubin, Cupertino, Calif.

[73] Assignee: Advanced Micro Devices, Inc., Sunnyvale, Calif.

[21] Appl. No.: 08/984,352

[22] Filed: Dec. 3, 1997

[51] Int. Cl.[7] .................................................. H01L 21/44
[52] U.S. Cl. ..................... 438/687; 438/627; 438/631; 438/637; 438/675; 438/678
[58] Field of Search ................................ 438/464, 653, 438/654, 660, 675, 688, 909, 927, 977, 614, 615, 627, 631, 637, 678, 687

[56] References Cited

U.S. PATENT DOCUMENTS

| | | | |
|---|---|---|---|
| 4,692,349 | 9/1987 | Georgiou et al. | 438/655 |
| 5,185,292 | 2/1993 | VanVonno et al. | 438/977 |
| 5,250,843 | 10/1993 | Eichelberger | 257/692 |
| 5,275,330 | 1/1994 | Issacs et al. | 228/180.21 |
| 5,340,947 | 8/1994 | Credle et al. | 174/262 |
| 5,371,042 | 12/1994 | Ong | 438/653 |

*Primary Examiner*—Charles Bowers
*Assistant Examiner*—Reneé R. Berry
*Attorney, Agent, or Firm*—Monica H. Choi

[57] ABSTRACT

A method for filling, with a conductive material, a high aspect ratio opening such as a via hole or a trench opening within an integrated circuit minimizes the formation of voids and seams. This conductive material such as copper which fills the high aspect ratio opening is amenable for fine line metallization. The method of the present invention includes steps for enhancing copper plating processes such as copper electroplating or copper electroless plating. This method includes a first step of copper plating for depositing a thin layer of copper within the integrated circuit opening. This thin layer preferably has a thickness on the field regions surrounding the opening that is less than ½ of the width of the opening. Then, copper reflow heats this thin deposited copper layer within the opening to minimize the occurrence of any seams within this copper layer. Finally, a second step of copper plating completely fills the integrated circuit opening. This two-step copper plating process with intermittent copper reflow minimizes formation of seams and subsequently minimizes eletromigration failure within filled integrated circuit openings having high aspect ratio.

15 Claims, 3 Drawing Sheets

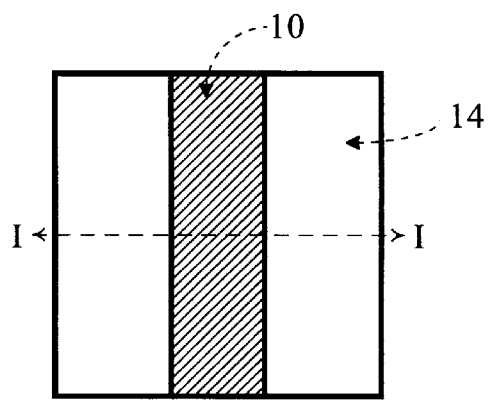
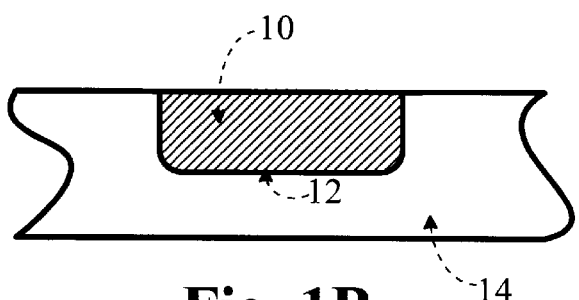
Fig. 1A
Fig. 1B
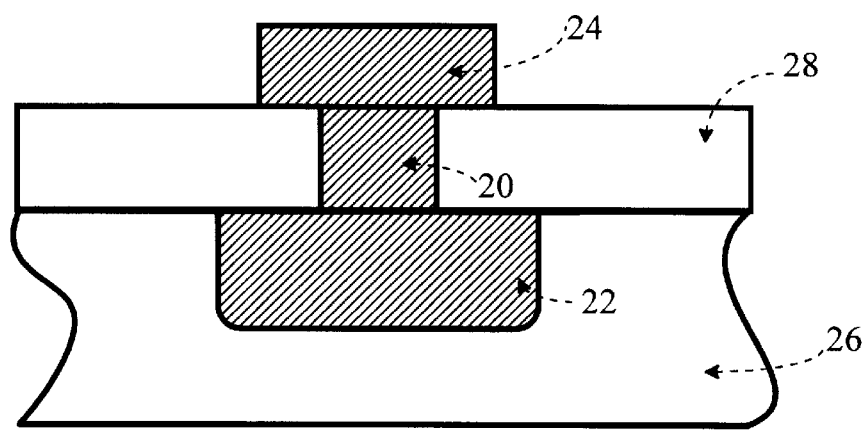
Fig. 2
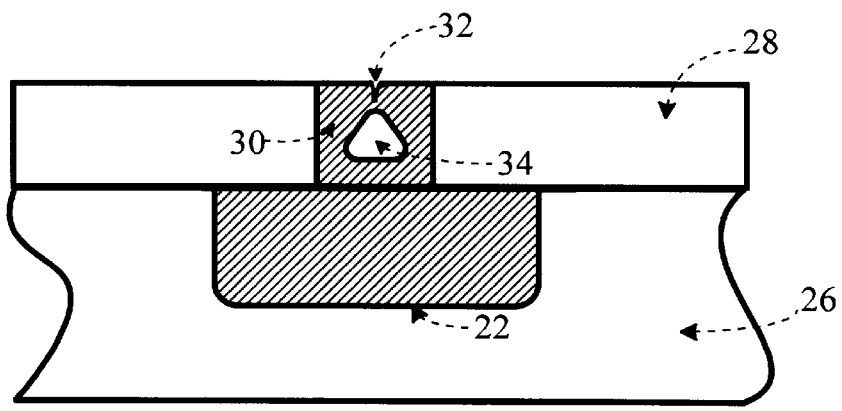
Fig. 3
(Prior Art)

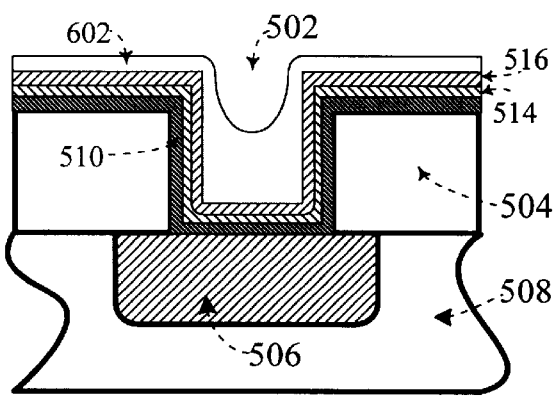 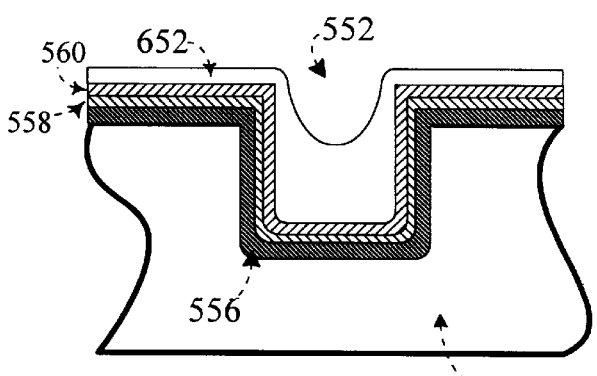
Fig. 7A  Fig. 7B
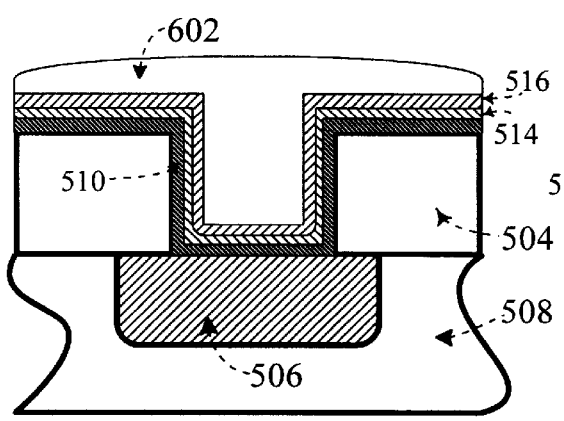 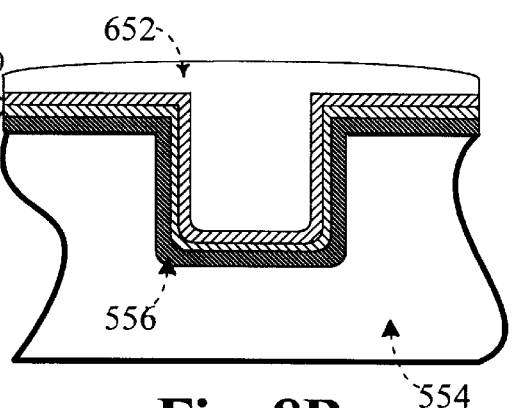
Fig. 8A  Fig. 8B
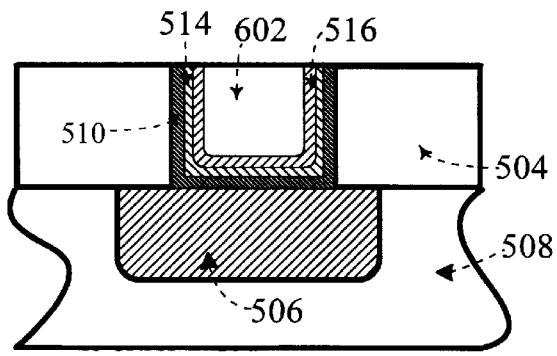 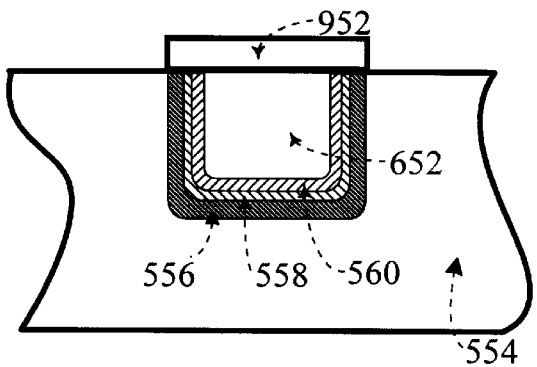
Fig. 9A  Fig. 9B

6,077,780

METHOD FOR FILLING HIGH ASPECT RATIO OPENINGS OF AN INTEGRATED CIRCUIT TO MINIMIZE ELECTROMIGRATION FAILURE

TECHNICAL FIELD

This invention relates to metallization in integrated circuits, and more particularly, to filling a high aspect ratio opening within an integrated circuit using a method that minimizes electromigration failure of conductive material filling the opening.

BACKGROUND OF THE INVENTION

As the width of metal lines are further scaled down to submicron and nanometer dimensions, electromigration failure and joule heating may lead to integrated circuit failure. Thus, copper which has lower bulk resistivity, higher melting point, and higher heat conductivity than aluminum is considered more viable for fine line metallization.

Referring to FIGS. 1A and 1B, FIG. 1A shows a top view of a copper line, and FIG. 1B shows a cross sectional view of the copper line of FIG. 1A along line AA. Because copper is not a volatile metal, copper cannot be easily etched away in a deposition and etching process as typically used for aluminum metallization. Thus, a copper line 10 is typically formed by etching a trench 12 as an opening within a trench insulating layer 14. The trench 12 is then filled with copper.

Referring to FIG. 2, another opening that is filled in copper metallization is a via hole 20. Copper filled within the via hole 20 conductively couples a bottom level copper line 22 to a top level copper line 24. The bottom level copper line 22 is disposed within a bottom insulating layer 26 and below an interlevel insulating layer 28. The top level copper line 24 is disposed above the interlevel insulating layer 28.

As the width of metal lines are scaled down to submicron and nanometer dimensions, openings such as trenches and via holes have a higher aspect ratio (defined as depth of opening to width of opening). However, filling an opening with a higher aspect ratio may lead to formation of a larger quantity and a larger size of voids and seams within the filled opening.

For example, in the prior art, vias and trenches have been filled by using copper sputtering followed by copper reflow. However, copper sputtering is not conformal deposition. Referring to FIG. 3, the top of a via opening 30 may be pinched at the early stage of copper deposition. Such pinching 32 results in formation of a large void 34 within the copper filling the opening 30. Additionally, copper reflow by heating the copper filled within the opening may not be efficient enough to satisfactorily minimize such a void. The presence of voids increases the chance for electromigration failure of copper within the opening 30. Thus, copper sputtering with copper reflow may not be amenable for filling openings with high aspect ratio.

Copper plating processes such as copper electroplating and copper electroless plating are conformal deposition processes, and such conformal deposition processes may reduce the occurrence of a large void such as the large void 34 of FIG. 3. Furthermore, these copper plating processes have the advantages of low tool cost and high throughput. These copper plating processes typically require a seed layer of copper onto which copper is further deposited.

Because these copper plating processes are conformal deposition processes, trench or via openings having high aspect ratio may be filled with less void formation than by using the copper sputtering/reflow process. However, as the aspect ratio of an opening increases to more than 3:1, seams may still form even with copper plating processes. Referring to FIG. 4, a seam 40 is a void which may form near the center of the copper filling a via hole 42, even when a copper plating process is used to fill the via hole 42.

The presence of such a seam leads to a higher risk of electromigration failure of integrated circuits. Nevertheless, filling trench or via openings by copper electroplating and copper electroless plating is desirable for fine line metallization with submicron and nanometer dimensions.

SUMMARY OF THE INVENTION

Accordingly, a primary object of the present invention is to fill a high aspect ratio opening within an integrated circuit using an enhanced copper plating process to minimize seam formation and subsequently to minimize electromigration failure.

In a general aspect of the present invention, a method for filling, with a conductive material, an opening having a width and a depth within an integrated circuit includes steps for enhancing one of such electroplating or electroless plating processes. This method includes a step of partially filling the opening with the conductive material by one of electroplating and electroless plating. The present invention can be used to particular advantage when the conductive material filled by this step has a thickness, on the field region surrounding the opening, that is less than ½ of the width of the opening. The method further includes the step of reflowing this conductive material by heating the conductive material. These two prior steps ensure minimization of seam formation in trench or via openings with high aspect ratio.

The method also includes the step of completely filling the opening with the conductive material by one of electroplating and electroless plating. This step ensures that trench or via openings with either high or low aspect ratio are completely filled with the conductive material.

The present invention may be used to particular advantage for scaled down submicron integrated circuit metallization with submicron or nanometer dimensions, especially when the conductive material is copper and the opening is filled by copper electroplating or copper electroless plating.

In other aspects of the present invention, the method of the present invention may include other processing steps for filling a trench or via opening such as depositing a barrier layer, a wetting layer, or a seed layer before starting the plating process of filling the opening with the conductive material. In addition, the surface of the integrated circuit having the completely filled opening may be polished to remove excess conductive material deposited on field regions and to planarize the surface of the integrated circuit.

These and other features and advantages of the present invention will be better understood by considering the following detailed description of the invention which is presented with the attached drawings.

BRIEF DESCRIPTION OF THE DRAWINGS

FIG. 1A is a top view of a copper metal line within an insulator, and FIG. 1B is a cross-sectional view of the copper metal line of FIG. 1A;

FIG. 2 is a cross-sectional view of a via structure;

FIG. 3 is a cross-sectional view of a via structure having a large void formed from a copper sputtering/reflow process;

FIGS. 5A–9B are cross-sectional views of openings within an integrated circuit, depicting steps for filling the openings with minimization of seams within the conductive material filling the openings, according to a preferred embodiment of the present invention.

Figure 4:
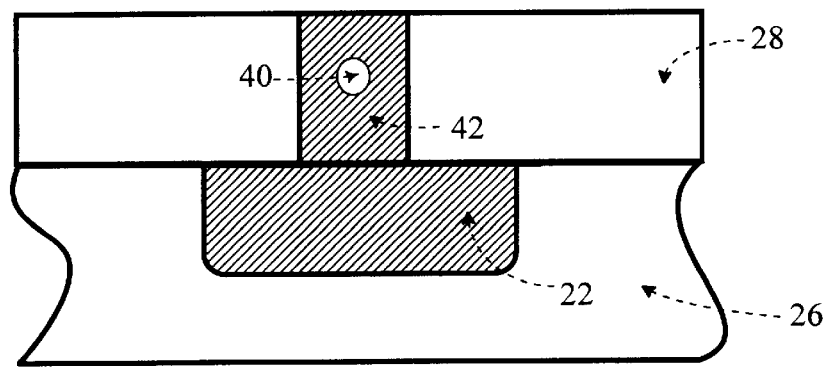
FIG. 4 is a cross-sectional view of a high aspect ratio via structure having a seam formed from a copper plating process.

The figures referred to herein are drawn for clarity of illustration and are not necessarily drawn to scale. Moreover, the figures referred to herein focus on openings that are part of a larger integrated circuit. Elements having the same reference numeral in FIGS. 1–9 refer to the same cross-sectional element.

DETAILED DESCRIPTION

Figure 5A:
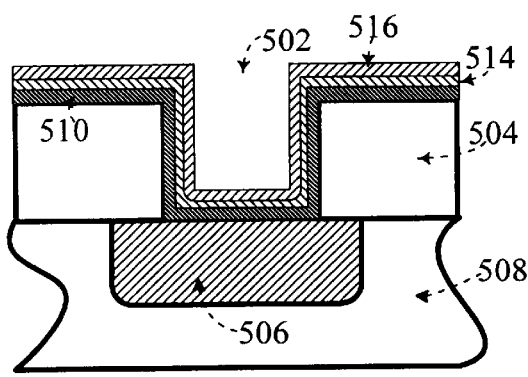
Figure 5B:
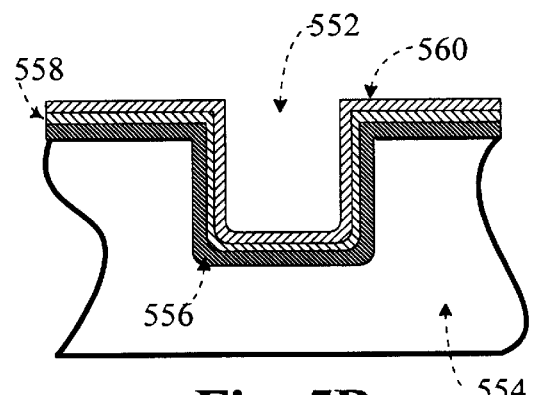

FIG. 5A shows a via hole 502, and FIG. 5B shows a trench opening 552 to be filled with copper, according to a preferred embodiment of the present invention. Referring to FIG. 5A, the via hole 502 is within an interlevel insulating layer 504. The copper within the via hole 502 conductively couples a copper layer 506 within a bottom insulating layer 508 to another copper layer (not shown in FIG. 5A for clarity of illustration) above the interlevel insulating layer 504. Referring to FIG. 5B, the trench 552 is an opening within a trench insulating layer 554 for forming a copper metal line.

Before filling the openings of FIG. 5A and 5B with copper according to a preferred embodiment of the present invention, other integrated circuit processing steps may also be included. For example, for the via hole 502 of FIG. 5A, a via barrier layer 510 is deposited, and this via barrier layer 510 impedes diffusion of copper from the via hole 502 into the interlevel insulating layer 504. Similarly, referring to FIG. 5B, a trench barrier layer 556 is deposited to cover the trench insulating layer 554 to impede diffusion of copper from the trench opening 552 into the trench insulating layer 554.

With such barrier layers 510 and 556, the insulating integrity of the insulating layer surrounding the copper is preserved. The diffusion rate of copper in these barrier layers is significantly less than the diffusion rate of copper in an insulating layer. The barrier layers 510 and 556 may be comprised of at least one of tantalum, tantalum nitride, tantalum copper, tantalum silicon nitride, tungsten, tungsten nitride, tungsten silicon nitride, titanium nitride, titanium/titanium nitride, and titanium silicon nitride. These barrier layer materials may be deposited by one of chemical vapor deposition or physical vapor deposition (i.e. a sputtering deposition).

In addition to barrier layers 510 and 556, the via hole 502 of FIG. 5A and the trench opening 552 of FIG. 5B may also require deposition of a copper seed layer for the copper plating process of the present invention. Before deposition of a copper seed layer within the via hole 502, a thin (less than 10 nanometer thick) via wetting layer 514 may be deposited on top of the via barrier layer 510 to prevent copper agglomeration (or dewetting) during reflow. Similarly, before deposition of a copper seed layer within the trench opening 552, a thin trench wetting layer 558 may be deposited on top of the trench barrier layer 556. The wetting layers 514 and 558 may be comprised of at least one of titanium, aluminum, silicon, magnesium, palladium, tin, cobalt, nickel, iron, chromium, zinc, cadmium, gold, beryllium, platinum, and manganese, or their copper-included alloys, or copper tantulum, or copper tungsten.

After depositing the wetting layers 514 and 558, a via copper seed layer 516 is deposited on top of the via wetting layer 514, and a trench copper seed layer 560 is deposited on top of the trench wetting layer 558. The copper seed layers 516 and 560 may be deposited by one of chemical vapor deposition and physical vapor deposition (i.e. a sputtering deposition).

The via hole 502 and the trench opening 552 are now ready to be plated with copper. The via hole 502 and the trench opening 552 have a relatively high aspect ratio (greater than 3:1), and are filled with a method for minimizing seam formation within the copper that fills the via hole 502 and the trench opening 552.

Figure 6A:
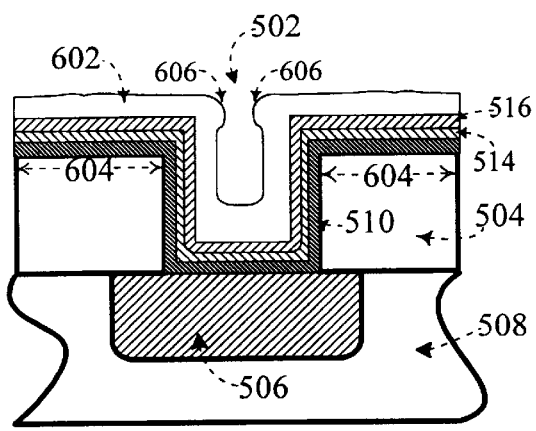
Figure 6B:
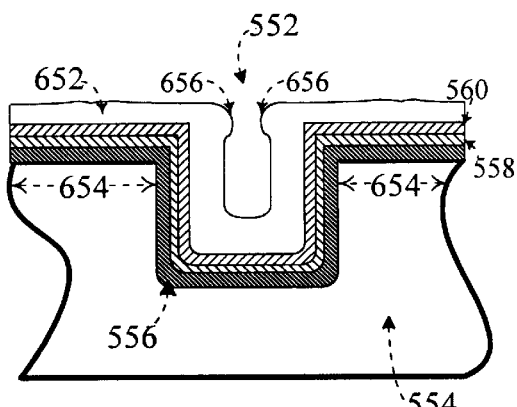

The method according to a preferred embodiment of the present invention first includes a first copper electroplating or electroless plating step that partially fills the via hole 502 or trench opening 552. Referring to FIGS. 6A and 6B, for the via hole 502, a first via copper layer 602 is deposited by an electroplating or electroless plating process on the via seed layer 516. Similarly, for the trench opening 552, a first trench copper layer 652 is deposited by an electroplating or an electroless plating process on the trench seed layer 560. According to a preferred embodiment of the present invention, an organic-free plating solution may be used in this first plating step to reduce the amount of carbon incorporated into the plated copper.

This copper filling step does not close the top of the via hole 502 or the trench opening 552. The respective thickness of the plated copper on via field regions 604 (surrounding the via opening 502) and on the trench field regions 654 (surrounding the trench opening 552) is preferably less than ½ of the width of the via hole 502 and of the trench opening 552 respectively. Such a thickness minimizes the chance that any via copper overhang 606 at the top of the via hole 502 closes up the via hole 502 and that any trench copper overhang 656 at the top of the trench opening 552 closes up the trench opening 552.

After the first copper plating process, a copper reflow step heats the copper within the first via copper layer 602 and the first trench copper layer 652. Referring to FIGS. 7A and 7B, this copper reflow step further fills the via hole 502 and the trench opening 552 with copper and minimizes any overhang 606 and 656 of FIGS. 6A and 6B respectively, which in turn minimizes the occurrence of any seams within the copper filling the via hole 502 or the trench opening 552. This copper reflow step according to a preferred embodiment of the present invention may include at least one of thermal annealing, laser reflow, or rapid thermal annealing (RTA) with temperatures above 200° Celsius.

Referring to FIGS. 8A and 8B, after the copper reflow step, a second copper plating step completely fills the via hole 502 and the trench opening 552. This second copper plating step may be by at least one of copper electroplating and copper electroless plating. This second copper plating step ensures that larger width integrated circuit openings having a lower aspect ratio are completely filled with copper.

An additional processing step may be included to polish the surface of the integrated circuit holding the via hole 502 and the trench opening 552. Referring to FIGS. 9A and 9B, the integrated circuit surface has been thus polished to remove the excess copper from the via field regions 604 and from the trench field regions 654. The surface of the integrated circuit holding the via hole 502 and the trench opening 552 is now a smooth surface.

Additionally, the top surface of the copper line 652 may be passivated by using a dielectric such as silicon nitride or silicon oxygen nitride or by using a conductor such as titanium, aluminum, silicon, tin, magnesium, zinc, or cadmium. Such a passivation layer 952 may be deposited, annealed, and selectively dissolved from the field regions 654 outside the area of the trench opening 552.

In this manner, voids and seams within a filled high aspect ratio via hole or trench opening of an integrated circuit are minimized or completely eliminated. An enhanced copper plating process for filling a via hole or a trench opening according to a preferred embodiment of the present invention includes two copper plating steps with intermittent copper reflow to minimize voids and seams within a filled high aspect ratio via hole or trench opening. This minimization of voids and seams also minimizes electromigration failure of copper within a via hole or trench opening which in turn leads to better integrated circuit performance.

The foregoing is by way of example only and is not intended to be limiting. For example, the advantageous features of the present invention may be used in conjunction with other conductive materials, aside from just copper, that are amenable for fine line metallization. In addition, the present invention may be used for any filled high aspect ratio opening within an integrated circuit aside from just a via hole or a trench opening.

Furthermore, as will be understood by those skilled in the art, the integrated circuit structures described herein may be made or used in the same way regardless of their position and orientation. Accordingly, it is to be understood that terms and phrases such as "bottom wall," "side wall," "above," and "on top of" as used herein refer to the relative location and orientation of various portions of the structures with respect to one another, and are not intended to suggest that any particular absolute orientation with respect to external objects is necessary or required. The invention is limited only as defined in the following claims and equivalents thereof.

I claim:

1. A method for filling, with a conductive material, an opening having a width and a depth within an integrated circuit, said opening abutting a bottom metal line, the method comprising the steps of:
   A. performing a first deposition of said conductive material by one of electroplating and electroless plating to partially fill the opening with the conductive material;
   B. reflowing the conductive material filled within the opening by heating the conductive material filled within the opening, after said step A of performing said first deposition to partially fill the opening;
   wherein said conductive material partially fills said opening after said step B of reflowing the conductive material within said opening; and
   C. performing a second deposition of said conductive material by one of electroplating and electroless plating to completely fill the opening with the conductive material, after said step B of reflowing the conductive material that partially fills the opening.

2. The method of claim 1, wherein the conductive material filled within the opening by step A has a thickness on field regions surrounding the opening that is less than ½ of the width of the opening.

3. The method of claim 1, further including the step of, before step A:
   depositing a barrier layer within the opening to impede diffusion of the conductive material within the opening into insulating material surrounding the opening.

4. The method of claim 3, wherein the conductive material is copper and wherein the barrier layer is comprised of at least one of tantalum, tantalum nitride, tantalum copper, tantalum silicon nitride, tungsten, tungsten nitride, tungsten silicon nitride, titanium nitride, titanium/titanium nitride, and titanium silicon nitride.

5. The method of claim 1, further including the step of, before step A:
   depositing a seed layer of the conductive material within the opening.

6. The method of claim 5, wherein the seed layer is deposited by one of chemical vapor deposition and physical vapor deposition.

7. The method of claim 5, further including the step of:
   depositing a wetting layer within the opening before the step of depositing the seed layer.

8. The method of claim 7, wherein the conductive material is copper, and wherein the wetting layer has a thickness less than ten nanometers, and wherein the wetting layer is comprised of at least one of titanium, aluminum, silicon, magnesium, palladium, tin, cobalt, nickel, iron, chromium, zinc, cadmium, gold, beryllium, platinum, and manganese, copper tantalum and copper tungsten, and a copper-included alloy of one of titanium, aluminum, silicon, magnesium, palladium, tin, cobalt, nickel, iron, chromium, zinc, cadmium, gold, beryllium, platinum, and manganese.

9. The method of claim 1, further including the step of:
   polishing a surface of the integrated circuit having the filled opening to remove excess conductive material deposited on field regions surrounding the opening and to planarize the surface of the integrated circuit.

10. The method of claim 9, further including the step of:
    passivating the top of the conductive material within the opening.

11. The method of claim 10, wherein the step of passivating uses as a passivation dielectric at least one of silicon nitride, silicon oxygen nitride, titanium, aluminum, silicon, tin, magnesium, zinc, and cadmium.

12. The method of claim 1, wherein the opening within the integrated circuit is one of a via hole and a trench within an insulating layer.

13. The method of claim 1, wherein the conductive material is copper.

14. The method of claim 1, wherein step A further includes the step of:
    using an organic-free plating solution in the electroplating and the electroless plating to reduce carbon impurities within the conductive material.

15. A method for filling, with copper, a via hole having a width and a depth within an integrated circuit, the via hole abutting a bottom level copper line, the method comprising the steps of:
    A. depositing a barrier layer within the via hole to impede diffusion of copper within the via hole into insulating material surrounding the via hole, wherein the barrier layer is comprised of one of tantalum, tantalum nitride, tantalum copper, tantalum silicon nitride, tungsten, tungsten nitride, tungsten silicon nitride, titanium nitride, titanium/titanium nitride, and titanium silicon nitride;
    B. depositing a wetting layer within the via hole, wherein the wetting layer has a thickness less than ten nanometers, and wherein the wetting layer is comprised of one of titanium, aluminum, silicon, magnesium, palladium, tin, cobalt, nickel, iron, chromium, zinc, cadmium, gold, beryllium, platinum, and manganese, copper tantalum and copper tungsten, and a copper-included alloy of one of titanium, aluminum, silicon, magnesium, palladium, tin, cobalt, nickel, iron, chromium, zinc, cadmium, gold, beryllium, platinum, and manganese;
    C. depositing a seed layer of copper within the via hole, wherein the seed layer is deposited by one of chemical vapor deposition and physical vapor deposition;

D. performing a first deposition of copper by one of electroplating and electroless plating to partially fill the via hole with copper using an organic-free plating solution to reduce carbon impurities within the copper, wherein the copper filled within the via hole has a thickness on field regions surrounding the via hole that is less than ½ of the width of the via hole;

E. reflowing the copper within the via hole by heating the copper within the via hole, after said step D of performing said first deposition to partially fill the via hole; wherein said copper partially fills said via hole after said step E of reflowing the copper within said via hole;

F. performing a second deposition of copper by one of electroplating and electroless plating to completely fill the via hole with copper, after said step E of reflowing the copper that partially fills the via hole; and G. polishing a surface of the integrated circuit having the filled via hole to remove excess copper deposited on field regions surrounding the via hole and to planarize the surface of the integrated circuit.

* * * * *